(12) United States Patent
Mimura et al.

(10) Patent No.: US 7,823,730 B2
(45) Date of Patent: Nov. 2, 2010

(54) SUBSTRATE STORAGE CONTAINER

(75) Inventors: Hiroshi Mimura, Kawagoe (JP);
Wataru Niiya, Itoigawa (JP);
Toshitsugu Yajima, Maebashi (JP)

(73) Assignee: Shin-Etsu Polymer Co., Ltd., Chuo-Ku, Tokyo (JP)

( * ) Notice: Subject to any disclaimer, the term of this patent is extended or adjusted under 35 U.S.C. 154(b) by 1038 days.

(21) Appl. No.: 10/525,502

(22) PCT Filed: Aug. 19, 2003

(86) PCT No.: PCT/JP03/10465

§ 371 (c)(1),
(2), (4) Date: Feb. 23, 2005

(87) PCT Pub. No.: WO2004/025721

PCT Pub. Date: Mar. 25, 2004

(65) Prior Publication Data

US 2005/0247594 A1    Nov. 10, 2005

(30) Foreign Application Priority Data

Sep. 11, 2002 (JP) ............................. 2002-265596
Sep. 20, 2002 (JP) ............................. 2002-275495

(51) Int. Cl.
*B65D 85/30* (2006.01)
*B65D 51/16* (2006.01)
*H01L 21/02* (2006.01)

(52) U.S. Cl. ..................... 206/710; 206/711; 206/454

(58) Field of Classification Search .............. 206/710, 206/711, 454, 832, 833, 449; 220/367.1, 220/371, 372, 373, 745; 211/41.18; 137/78.5, 137/508, 38, 511; 141/98

See application file for complete search history.

(56) References Cited

U.S. PATENT DOCUMENTS

| 4,666,479 | A |   | 5/1987  | Shoji |
|-----------|---|---|---------|-------|
| 5,255,797 | A | * | 10/1993 | Kos ........................... 211/41.18 |
| 5,468,112 | A |   | 11/1995 | Ishii et al. |
| 5,575,394 | A | * | 11/1996 | Nyseth ......................... 206/710 |

(Continued)

FOREIGN PATENT DOCUMENTS

EP          0617573 A1    9/1994

(Continued)

*Primary Examiner*—Mickey Yu
*Assistant Examiner*—Steven A. Reynolds
(74) *Attorney, Agent, or Firm*—Buchanan Ingersoll & Rooney PC

(57) ABSTRACT

A substrate storage container which includes: a front-opening box type container body for storing a multiple number of substrates in alignment therein; a door for opening and closing the open front of the container body in a sealing manner; and inner-pressure adjustment devices attached to the mounting ports in the container body and the door for adjusting the pressure inside the container body closed with the door. The inner-pressure adjustment device is configured of an elastic attachment cylinder, a filter support structure fitted into, and protected by, the attachment cylinder and a multiple number of filters held inside the filter support structure. Since the inner-pressure adjustment device can be set by mounting an attachment cylinder of a simple structure by use of elastic deformation to the attachment hole, which is provided for the container body and/or the door, there is no need of forming screw holes which need time and effort.

6 Claims, 10 Drawing Sheets

U.S. PATENT DOCUMENTS

| | | | |
|---|---|---|---|
| 5,586,658 A * | 12/1996 | Nyseth | 206/711 |
| 5,664,679 A | 9/1997 | Schneider et al. | |
| 5,706,946 A * | 1/1998 | Kakizaki et al. | 206/454 |
| 5,782,362 A * | 7/1998 | Ohori | 206/711 |
| 5,788,082 A * | 8/1998 | Nyseth | 206/711 |
| 5,858,103 A * | 1/1999 | Nakajima et al. | 118/728 |
| 5,879,458 A * | 3/1999 | Roberson et al. | 118/715 |
| 5,960,960 A * | 10/1999 | Yamamoto | 206/711 |
| 6,032,802 A * | 3/2000 | Ejima et al. | 206/711 |
| 6,105,781 A | 8/2000 | Ejima et al. | |
| 6,199,604 B1 * | 3/2001 | Miyajima | 141/98 |
| 6,267,245 B1 * | 7/2001 | Bores et al. | 206/711 |
| 6,732,877 B2 * | 5/2004 | Wu et al. | 220/300 |
| 7,017,758 B2 * | 3/2006 | Hua et al. | 211/41.18 |
| 2002/0130061 A1 * | 9/2002 | Hengst | 206/710 |

FOREIGN PATENT DOCUMENTS

| | | |
|---|---|---|
| EP | 774774 A2 | 5/1997 |
| JP | 5-251548 A | 9/1993 |
| JP | 8-7637 Y2 | 3/1996 |
| JP | 11-233607 A | 8/1999 |
| JP | 11-238788 A | 8/1999 |
| JP | 2000-159288 | 6/2000 |

* cited by examiner

SUBSTRATE STORAGE CONTAINER

TECHNICAL FIELD

The present invention relates to a substrate storage container for use in storage, transportation, keeping and processing and the like of semiconductor wafers, mask glasses or other substrates, and more detailedly relates to filters that control the differential air pressure between inside and outside the substrate storage container and a supporting structure for substrates.

BACKGROUND ART

In the recent semiconductor industry, in order to further enhance the productivity, substrates such as silicon wafers, glass wafers with a large-diametric size of 300 mm have started being used. Though the substrates of this type contributes to development of chips into large size and improvement of productivity, they are liable to flex due to gravity when placed either horizontally or when stood upright. Therefore, it is demanded that these substrates should be stored in a predetermined substrate storage container and handled safely so as to avoid damage to these.

One example of the predetermined substrate storage container is composed of, as partly shown in FIG. 17, a front-opening box type, container body 1 for storing a multiple number of substrates W in alignment, an unillustrated door for opening and closing the open front of the container body 1, and a seal-gasket disposed between container body 1 and the door for seal when the door is closed. This container provides the function of preventing breakage of substrates W, and is basically handled in a horizontal position though it may be handled vertically in an upright position as shown in the figure (Japanese Patent Application Laid-open Hei 2000-159288).

In the production process, substrates W are handled in their horizontal position by automaton when they are inserted into or taken out from the substrate storage container. However, in a special process such as examination or the like, the container body 1 is set with its front opening up and the substrates are handled manually or automatically as they are being kept upright (see FIG. 17). In this case, when the door is removed, substrates W are supported by a rear retainer 8 only, which is located at the bottom.

Container body 1 of the substrate storage container has shelf elements 2 disposed on both side of the interior for supporting substrates W in the horizontal position and also has rear retainer 8 on the interior backside (see FIG. 18). This rear retainer 8 supports the interior peripheral edge of substrate W and functions to determine the position of placement of substrate W when substrate W is loaded. Attached to the interior side of the door is a front retainer that individually supports the front peripheral edges of substrates W.

Rear retainer 8 of container body 1 and the front retainer of the door are formed of a material more flexible than that of shelf elements 2 because it should come into protective contact with substrates W. Formed at the contact positions with substrates W are a plurality of shallow holding grooves 80 formed in parallel to each other at regular intervals. Each holding groove 80 has an approximately U-shaped or approximately V-shaped section with slanting surfaces, and the midpoint of the height of each groove is set at a position higher than the position at which the substrate is placed on corresponding shelf element 2 (see FIG. 18), so that substrates W can be marginally lifted from shelf elements 2 when the door is closed, whereby contact friction between substrates W and shelf elements 2 can be reduced and pollution of substrates W due to abrasive particles can be prevented.

In addition to the breakage prevention of substrates W, the substrate storage containers of this kind are demanded to be highly sealed so that substrates W will not be polluted. However, this requirement may cause differential air pressure between inside and outside due to high speed transportation such as air shipment etc., and such differential air pressure may cause a fear of the door tightly sticking to container body 1 and becoming difficult to open. In order to solve such harmful influences, conventionally, there has been proposed a filter-equipped substrate storage container which has a container body 1, a door and a sealing gasket, and further includes an inner-pressure adjustment device for the container body enclosed with the door (see Japanese Patent Application Laid-open Hei 11 No. 233607).

The conventional substrate storage containers are configured as above. Because, in the case of a filter-equipped configuration, it is necessary to form a screw hole and screw a resinous inter pressure adjustment device into this screw hole, the problem of the mold for forming container body 1 becoming complex occurs.

Specifically, formation of the container body 1 with a mold inevitably necessitates a rotary mechanism when the mold is separated, so that it is impossible to make the mold structure simple. Other than the above technology, there is, of course, another proposed technique in which container body 1 is provided with an engaging claw so that it can hold an inner-pressure adjustment device. Also in this case, because some slide structures for avoidance of undercuts for mold separation are needed, it is impossible to avoid the mold structure from being complicated.

Further, in either method, because of the inner-pressure adjustment device being fitted to and held by container body 1, there is a risk that abraded particles may arise during transportation due to friction between container body 1 and the inner-pressure adjustment device and pollute substrates W and clean environments for substrate processes.

Moreover, with the conventional substrate storage container, even when the door is removed from container body 1, substrate W may stop at a partway position without sliding right down from the slanting surface of holding groove 80 of rear retainer 8, as shown in FIG. 18, thus giving rise to problems of inducing loading miss due to displacement of substrate W from the correct placement position or causing damage to substrate W due to interference between the substrate and the substrate chuck hand of an unloading robot.

Mentioned as a factor of the problem is largeness of the substrate W in diameter and hence easiness of its bending. Also, the shelf elements 2 with which substrate W comes into contact when the door is removed present a large frictional resistance, and gives resistance to the substrate while it slides down along the slanting surface. In addition, recently, not only the obverse surface of substrate W but the undersurface of substrate W is also mirror-finished as one of the countermeasures against particles (particulates), therefore increase in the frictional resistance between substrate W and shelf elements 2 may be spurred by adhesion between the mirror surfaces.

Further, when container body 1 is handled with its front opening up or with substrates W stood upright, the substrates W will be supported by shallow holder grooves 80 of rear retainer 8 only, hence substrates W tend to incline in either a front or rear direction. In this case, breakage and pollution problems may take place due to contact of substrates W with shelf elements 2 or due to adjacent substrates W leaning in opposing directions and touching each other on the opening side of container body 1.

DISCLOSURE OF INVENTION

The present invention has been devised in view of the above, it is therefore an object of the present invention to provide a substrate storage container that can prevent pollution of substrates and clean environments for substrate processing resulting from generation of abraded particles.

It is also another object of the present invention to provide a substrate storage container that can inhibit substrate breakage etc., by reducing the frictional resistance of shelf elements and can prevent substrate breakage by restraining the substrates from leaning so that the substrates will not touch the shelf elements or touch one another when the container is handled with the substrates stood upright.

In order to attain the above objects, the present invention includes: a container body of a front-opening box for storing substrates therein; a door for opening and closing the front of the container body; and an inner-pressure adjustment device attached to, at least, one of the container body and the door, for adjusting the pressure inside the container body closed with the door.

Here, it is preferred that the inner-pressure adjustment device is composed of an attachment cylinder, a hollowed filter support structure fitted into the attachment cylinder and a filter held inside the filter support structure.

Further, an attachment hole for the attachment cylinder may be formed in, at least, one of the container body and the door, and a guide rib for the inner-pressure adjustment device may be formed near the attachment hole.

Moreover, the attachment cylinder may have a flange projected from the outer peripheral surface thereof for hooking the attachment hole, the filter support structure may be formed of a pair of separate support pieces opposing each other, each supporting piece having an approximately cylindrical form, and the opposing parts of the supporting pieces may be extended outwards with respect to the width direction, forming filter holders.

Still, shelf elements for supporting substrates may be formed on both interior sides of the container body, and among the interior sides of the container body and the shelf elements, at least part of the substrate contact area of each shelf element may be formed with a low-frictional resistance portion that is lower in frictional resistance than the non substrate contact area of the shelf element.

Further more, grooves for supporting substrates may be formed at the interior backside of the container body, and the sectional shape of each groove may be configured to be asymmetrical with respect to the center line of the substrate when the substrate is placed horizontally.

Still more, it is preferred that the arithmetic average roughness of the low-frictional resistance portion is specified to be 0.2a or above in terms of the average roughness (Ra).

Here, the container body in claims is constructed so that its opening is opened and closed by the door. This door may or may not incorporate a latch mechanism for locking, which projects out and retracts multiple engagement claws or the like from the peripheral side of the door. Examples of the substrate at least, include a single or a plurality of semiconductor wafers, photomask glasses or others. The inner-pressure adjustment device may be attached to either the container body or the door, or may be attached to both the container body and the door. The number of the flanges of the attachment cylinder and the number of the filters may be either singular or plural. The filter support structure may or may not have flexibility and elasticity. The guide rib may be formed in various cylindrical forms, such as semicircular form, C-shape, U-shape, etc., in plan view. This guide rib may be formed in whole or part of the peripheral edge of the attachment hole.

Low-frictional resistance portions may be formed in the entire substrate contact area of the shelf element, or may be formed in both sides of the container body interior and the substrate contact areas of the shelf elements. When grooves for supporting substrates are provided on the interior backside of the container body, low-frictional resistance portions may be formed in, at least, part of each groove. Further, the arithmetic average roughness (Ra) is a value that is obtained by calculating the predetermined formula based on y=f(x) where, when a reference length in the direction of the mean line is cut out from the roughness curve which is represented as y=f(x), the X-axis being taken in the cutout direction and the Y-axis being taken in the longitudinal magnification.

According to the present invention, it is possible to attach the inner-pressure adjustment device to the container body and/or the door without using any screws, by making the filter support structure of the inner-pressure adjustment device hold filters, fitting the filter support structure into the attachment cylinder and fitting the attachment cylinder to the attachment hole in the container body and/or the door.

Further, when low-frictional resistance portions having low frictional resistance are formed in the substrate contact area of the shelf element, no substrate will stop partway within the holding groove of the retainer. Accordingly, it is possible to solve the problems such as displacement of the substrates from the correct positions and breakage of substrates due to interference of the substrate chuck hand, etc., with the substrates.

BEST MODE FOR CARRYING OUT THE INVENTION

Figure 1:
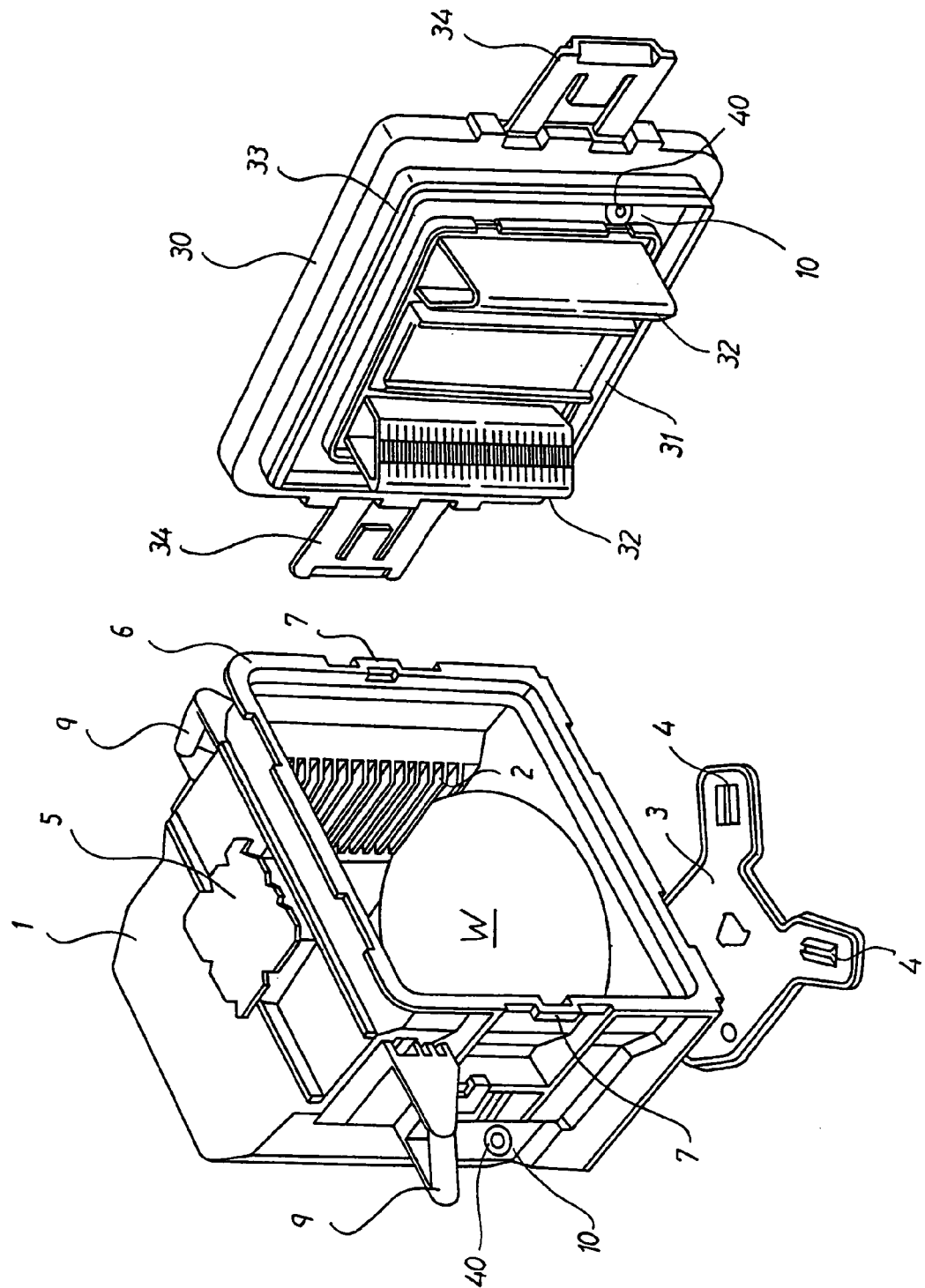
FIG. 1 is an exploded perspective illustration showing the embodiment of a substrate storage container according to the present invention.

The preferred embodiment of the present invention will hereinbelow be described with reference to the drawings. A substrate storage container of the present embodiment includes: as shown in FIGS. 1 to 5, a container body 1 for storing multiple substrates W in alignment; a door 30 for opening and closing the opening of this container body 1 in a sealing manner; and an inner-pressure adjustment device 40 for adjusting the inner pressure of container body 1 closed with door 30. This inner-pressure adjustment device 40 is composed of an elastic attachment cylinder 41, a filter support structure 43 fitted in and protected by this attachment cylinder 41 and a plurality of filters 46 held in this filter support structure 43.

As the multiple substrates W, a number (25 or 26 pieces) of semiconductor wafers, for example, can be mentioned, as shown in FIG. 1. More detailedly, round silicon wafers of 300 mm in diameter and others can be used.

As shown in FIG. 1, container body 1 is formed as a front-opening box type, having an opening on the front, using, for example, transparent polycarbonate or the like. Provided on both the interior opposing sides are a multiple number of shelf elements 2 arranged vertically, so that pairs of opposing shelf elements 2 support multiple substrates W in their horizontal position with a predetermined pitch along the vertical direction. An approximately Y-shaped, in plan view, bottom plate 3 having through-holes for detection and discrimination of the substrate storage container type is removably attached to the bottom of this container body 1. This bottom plate 3 has positioning members 4 having an approximately V-shaped section and arranged at both sides in front and one in the rear for positioning with respect to processing equipment. Further, a mounting port 10 for an inner-pressure adjustment device is provided at a lower position on one side of container body 1, as shown in FIG. 1. At this mounting port 10 a round attachment hole is perforated.

An approximately rectangular, in plan view, handle 5 is removably attached to the top of container body 1. This handle 5 is held by an unillustrated automated transfer system called OHT (overhead hoisting transfer), whereby the substrate storage container is transferred from one step to another. A rim portion 6 for door fitting shown in FIG. 1 is integrally formed outward and sideward from the periphery of the front opening of container body 1. A pair of engaging portions 7 having engaging grooves for door 30 are integrally and projectively formed on both sides of rim portion 6. A multiple number of rear retainers for supporting substrates W at their rear edge are provided left and right on the interior backside of container body 1.

Carrying handles 9 for manual handling are detachably attached on both external sides of container body 1. Each carrying handle 9 has two carrying portions formed approximately at right angles in an inverted L-shape, L-shape, U-shape or the like so as to allow the operator to stably hold container body 1 in either case, whether substrates W stored in the substrate storage container are positioned horizontally or stood upright.

Figure 2:
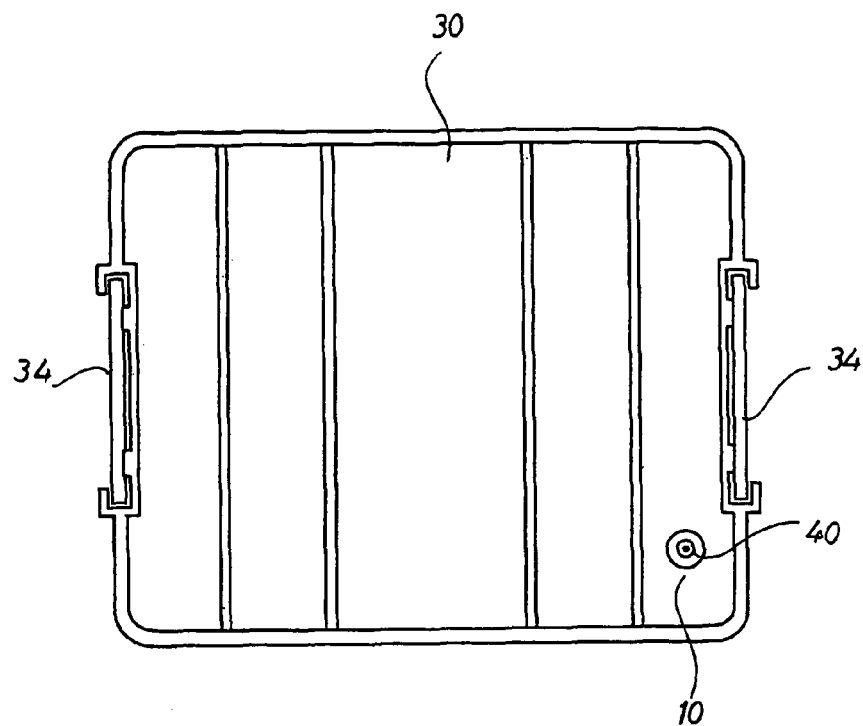
FIG. 2 is a schematic illustration showing a door in the embodiment of a substrate storage container according to the present invention.
Figure 3:
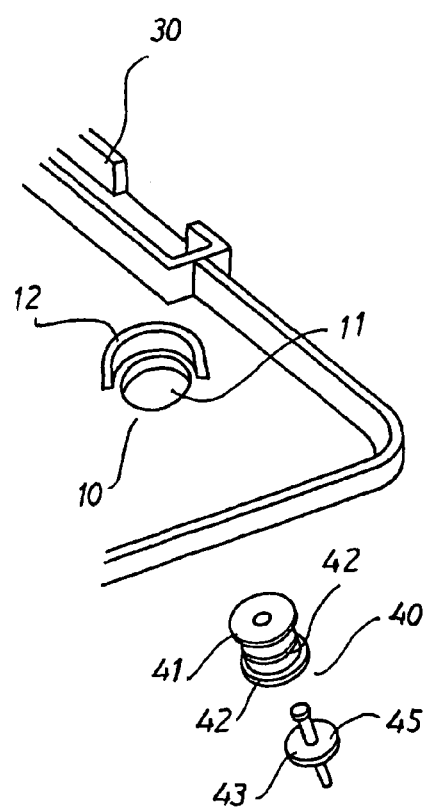
FIG. 3 is a partial perspective illustration of FIG. 2.

Door 30 is formed in a laterally long, approximately rectangular shape with four corners rounded, and a stepped portion 31 that fits rim portion 6 of container body 1 is projectively formed on the interior side (rear side) of the door, as shown in FIGS. 1 to 3. Attached to this stepped portion 31 is an elastic front retainer 32 for supporting and aligning multiple substrates W in their horizontal position with a predetermined pitch along the vertical direction. An endless sealing gasket 33 is fitted to the stepped portion 31 of door 30, so that this sealing gasket 33 will assure sealability when the door is closed. A pair of engaging pieces 34 that will engage engaging portions 7 of container body 1 are pivotally supported on both sides of door 30. Another mounting port 10 for an inner-pressure adjustment device is formed at a lower portion of door 30, as shown in FIGS. 1 and 2. At this mounting port 10 around attachment hole 11 is perforated. An inner-pressure adjustment device guide rib 12 shown in FIG. 3 is projectively formed near the periphery of this attachment hole 11 in an approximately semicircular arc shape.

Here, container body 1, bottom plate 3, handle 5, a pair of carrying handles 9 and door 30 are formed using a thermoplastic resin such as, for example, polycarbonate, polyetherimide, polyetheretherketone, cyclic olefin polymer or the like.

Figure 4:
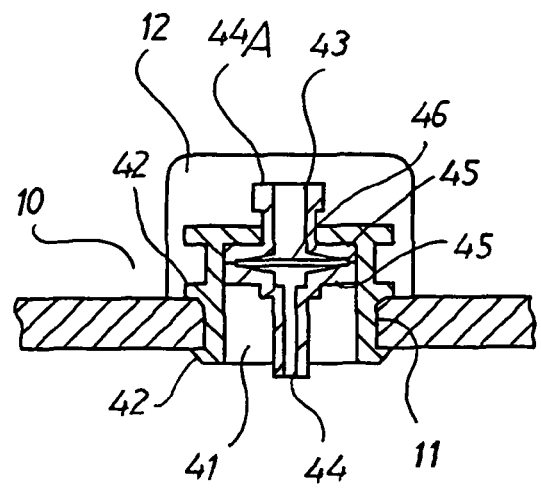
FIG. 4 is a sectional illustrative view showing an inner-pressure adjustment devise in the embodiment of a substrate storage container according to the present invention.
Figure 5:
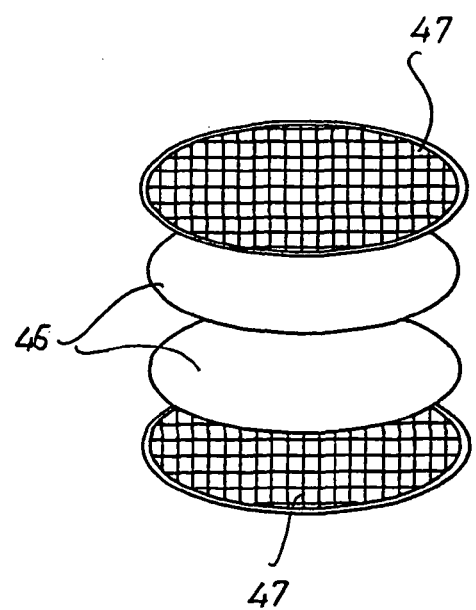
FIG. 5 is a perspective illustration showing filters and the like in the embodiment of a substrate storage container according to the present invention.

Inner-pressure adjustment device 40 is composed of, as shown in FIGS. 3 and 4, an elastic attachment cylinder 41 that is removably fitted to attachment hole 11 at mounting port 10, a hollow filter support structure 43 that is snugly fitted (without any gap) in the axial direction of the attachment cylinder 41 and partially exposed, and a multiple number of filters 46 held in the filter support structure 43, and prevents door 30 from being suctioned to container body 1 and becoming difficult to remove due to differential pressure between inside and outside of the substrate storage container.

Attachment cylinder 41 is formed of, for example, silicone rubber or the like, and formed in an approximately cylindrical shape having a large first opening at the bottom end face in FIG. 4 and a smaller second opening at the top end face in the same figure. On the outer periphery of the cylinder, multiple flanges 42 to be fitted and engaged with the periphery of attachment hole 11 are integrally formed in juxtaposition with each other along the axial direction. Filter support structure 43 is composed of a pair of support pieces 44 and 44A, which each are formed to have an approximately T-shaped section or shaped funnel-like and arranged opposite and bonded or welded to each other, and provides the function of communicating between inside and outside of the sealed substrate storage container. As shown in FIG. 4, each of support pieces 44 and 44A basically has an elongated, approximately cylindrical form with its opposing contact at the end enlarged radially outwardly forming a hollowed filter holder 45. The hollows of these filter holders 45 confine and grip multiple filters 46.

Examples of the material for attachment cylinder 41 and filter support structure 43 include thermoplastic resins such as polypropylene, polyethylene, polycarbonate, polyethylene terephthalate and the like, thermoplastic elastomers such as polyester elastomers for housing, polyolefin elastomers, polystyrene elastomers and the like, fluoro rubber, EPDM rubber, butyl rubber, nitrile rubber, silicone rubber, urethane rubber and the like.

Multiple filters 46 are made up of molecular filtration filters of ethylene tetrafluoride, polyester fibers, porous Teflon (registered tradename) membranes, glass fibers, etc., or chemical filters composed of chemical absorbents supported on a filter base such as activated carbon fibers etc. These multiple filters 46 are laminated and held between multiple protective members 47 and placed in the hollow between filter holders 45 in paired support pieces 44 and 44A. Each protective member 47 has lots of passage holes and is formed in a thin circular shape similar to filters 46.

Here, the multiple filters 46 may be of a type presenting an identical function, but preferably include multiple types presenting different functions. For example, combination of a molecular filtration filter and a chemical filter can prevent not only particle pollution of substrates W but also prevent pollution due to organic gases.

In the above configuration, when inner-pressure adjustment device 40 is attached, multiple filters 46 are held in layers via protective members 47 between filter holders 45 of a pair of support pieces 44 and 44A, completing a filter support structure 43. This filter support structure 43 is tightly fitted from the first opening side toward the second opening side of attachment cylinder 41 so that part of support piece 44A penetrates out to the other side, the attachment cylinder 41 is tightly fitted to attachment hole 11 of each mounting port 10 by use of elastic deformation, then flanges 42 protruding from the outer peripheral side of attachment cylinder 41 are engaged with the peripheral edges at the top and bottom of attachment hole 11. In this way, it is possible to attach inner-pressure adjustment devices to container body 1 and door 30, in a simple manner.

According to the above configuration, inner-pressure adjustment devices 40 can be set by providing attachment holes 11 in container body 1 and door 30 and attaching and detaching the simply structured, attachment cylinders 41 to the attachment holes 11 by elastic deformation. Therefore, it is no longer necessary to form screw holes, which would require much time and effort, and the mold for forming container body 1 will never be complicated in its structure. In addition, it is also possible to easily detach inner-pressure adjustment devices 40 from container body 1 and door 30 at the time of cleaning and attach them again after cleaning. Further, since it is no longer necessary to provide any engaging claw for container body 1, no slide structure for avoidance of undercuts for mold separation is needed and hence it is possible to simplify the mold structure.

Since there is no need of engagement between high-hardness and high-rigidity resin elements no resin particles will be generated during transportation due to friction between container body 1 and inner-pressure adjustment device 40, hence it is possible to effectively eliminate the risk of polluting substrates W and clean environments for substrate processing. Further, since attachment cylinder 41 is formed of an elastic material which presents flexibility and forms a seal with attachment hole 11, no additional sealing element such as an O-ring and the like is needed. This markedly contributes to reduction in the number of parts and improvement in assembly work performance.

Moreover, since guide rib 12 is projectively formed along the periphery of attachment hole 11, this arrangement makes it possible to prevent inner-pressure adjustment device 40 from colliding with and damaging other substrate storage containers, and also markedly contributes to prevention against displacement. Further, since filter support structure 43 is convered and protected by attachment cylinder 41, it is possible to markedly improve sealing performance and hence effectively prevent air leakage.

Figure 6:
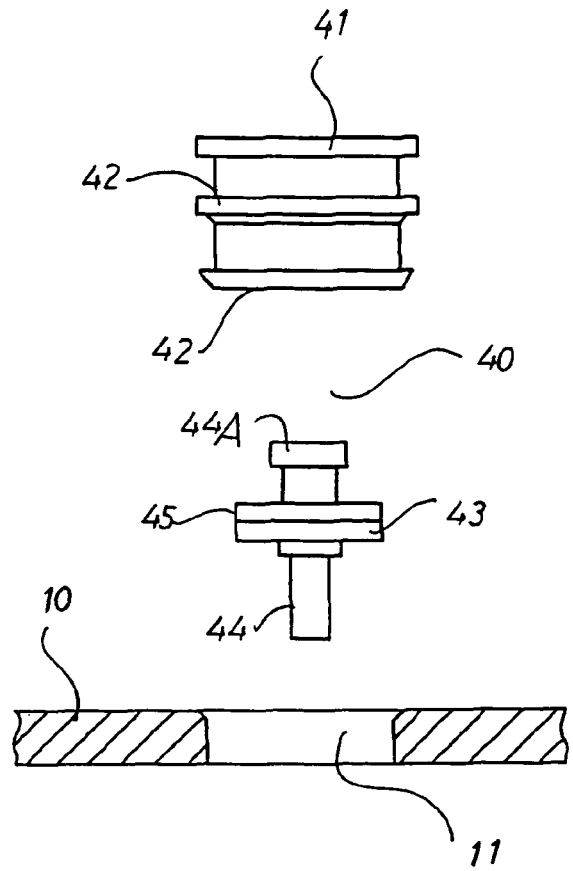
FIG. 6 is an exploded perspective illustration showing the second embodiment of a substrate storage container according to the present invention.
Figure 7:
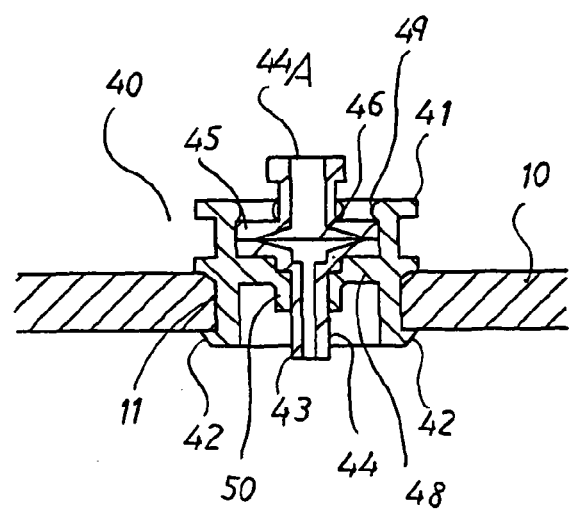
FIG. 7 is a sectional illustrative view showing an inner-pressure adjustment devise in the second embodiment of a substrate storage container according to the present invention.

Next, FIGS. 6 and 7 show the second embodiment of the present invention. In this embodiment, the second end opening of attachment cylinder 41 is made greater so as to allow filter support structure 43 to be inserted easily while a sectioning support piece 48 is projected radially inwards from the roughly mid height of the inner peripheral surface of attachment cylinder 41 so that this sectioning support piece 48 holds support piece 44 of filter support structure 43.

Along the peripheral edge of the second end opening of attachment cylinder 41, some engagement ribs 49 having an approximately semicircular section for checking dislocation of the inserted filter support structure 43 are formed a predetermined distance apart so as to project radially inwards. Sectioning support piece 48 is formed in a flat ring-like configuration having a passage hole at the center, and a cylindrical rim portion 50 is integrally formed extending downward, as shown in FIG. 7, from that passage hole. Support piece 44 of filter support structure 43 is fitted through this rim portion 50. Other components are the same as the above embodiment, so the description is omitted.

Also in this embodiment, the same operation and effect as in the above embodiment can be expected. In addition, even if filter support structure 43 is attached, more or less, on the skew, simple insertion of support piece 44 of filter support structure 43 into rim portion 50 of sectioning support piece 48 enables correction of positioning easily. Obviously, this feature markedly improves convenience. Further, since the surrounding of filters 46 is protected by sectioning support piece 48 of attachment cylinder 41, air leakage can be prevented to a low enough level to prevent pollution of the substrate storage container.

Next, FIGS. 8 to 16 show the third embodiment of the present invention. In this embodiment, each substrate contact area 22 of multiple shelf elements 2 that support substrates W at their side peripheral edges are formed, at least, partly with low-frictional resistance portions 23 that present a frictional resistance lower than that of the non substrate contact area of shelf element 2 while rear retainer 8 for supporting substrates W at their rear peripheral edge is formed with multiple holding grooves 80, each being integrally formed with a lean constraint element 81.

Figure 8:
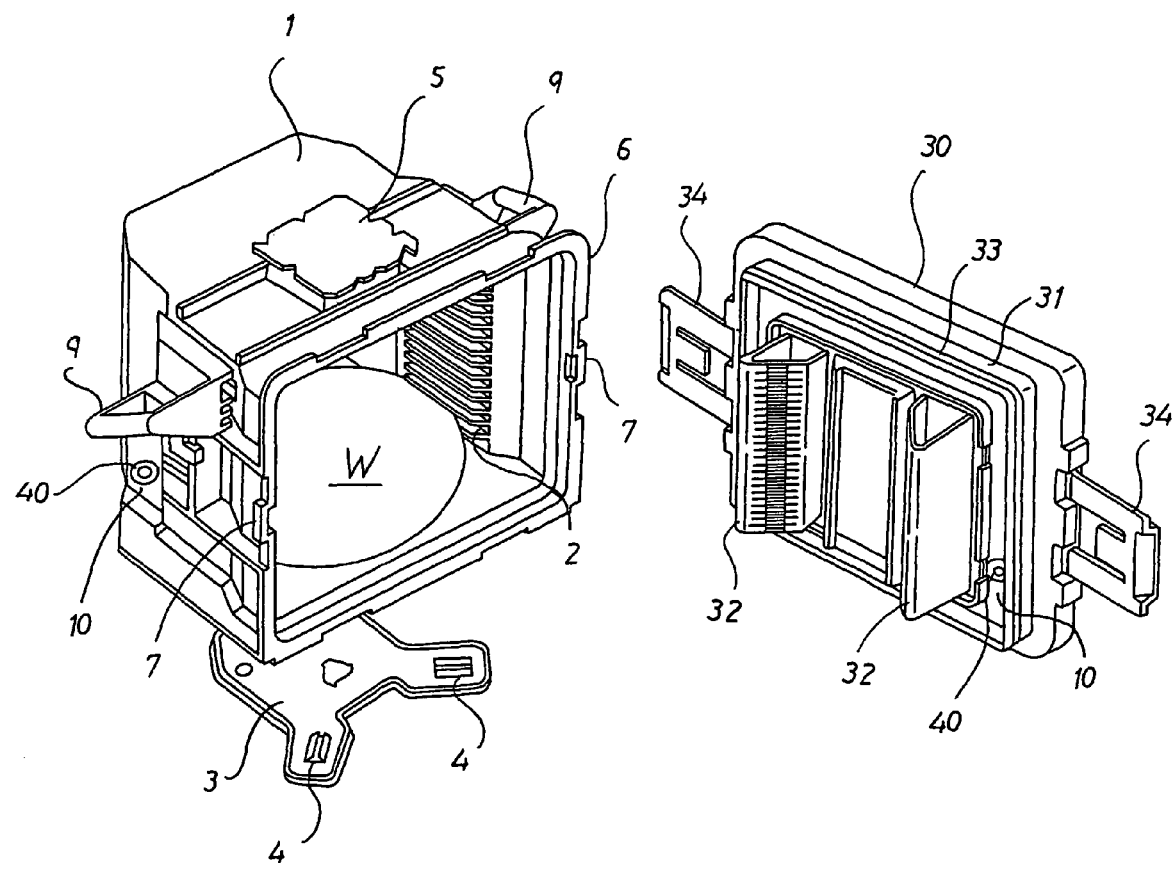
FIG. 8 is an exploded perspective illustration showing the third embodiment of a substrate storage container according to the present invention.
Figure 9:
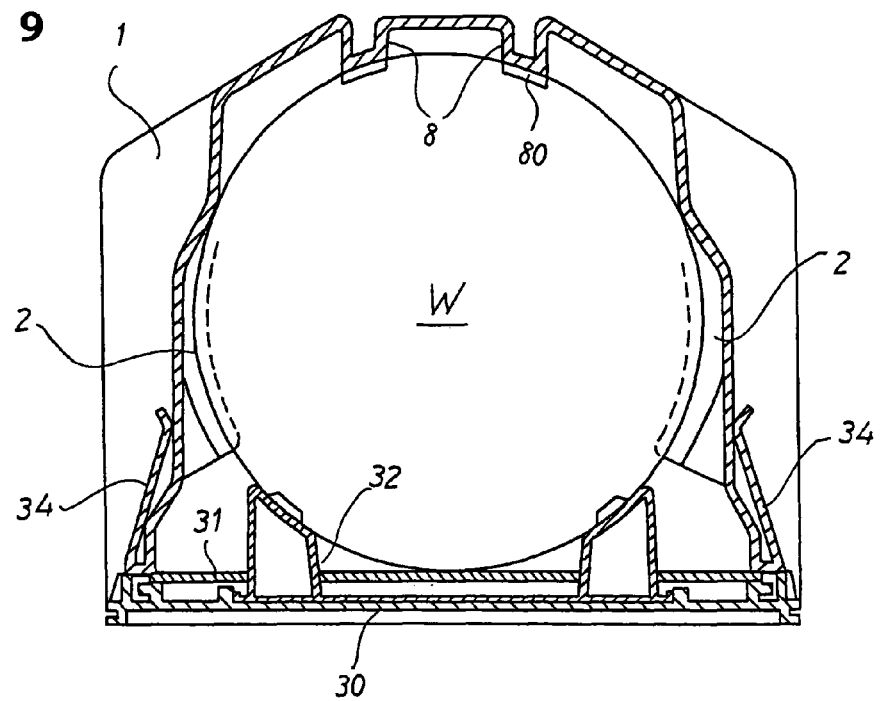
FIG. 9 is a cross-sectional illustration of FIG. 8.
Figure 10:
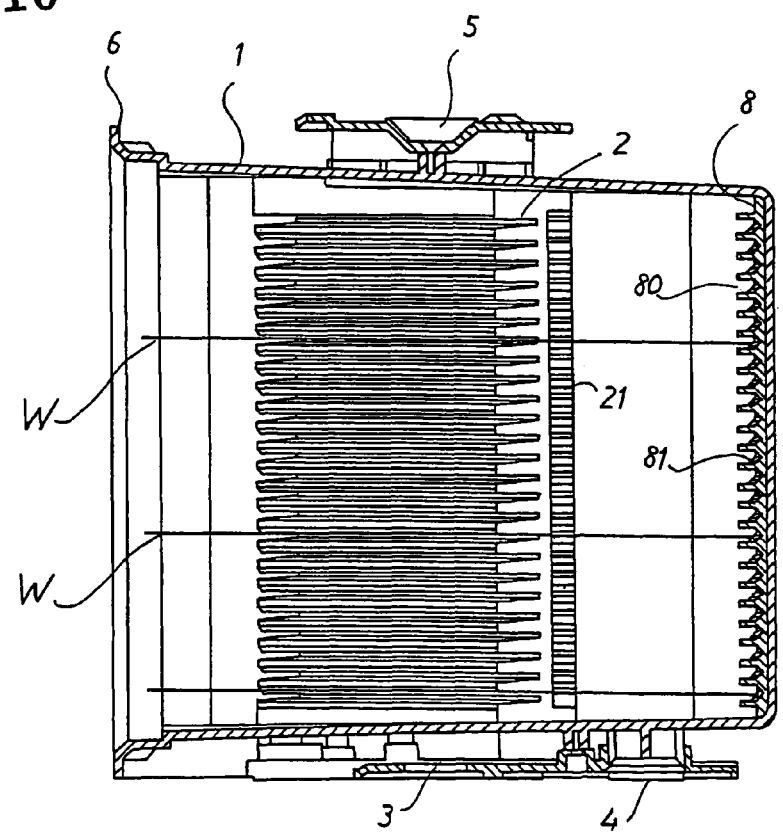
FIG. 10 is a vertical sectional illustration of FIG. 8.
Figure 11:
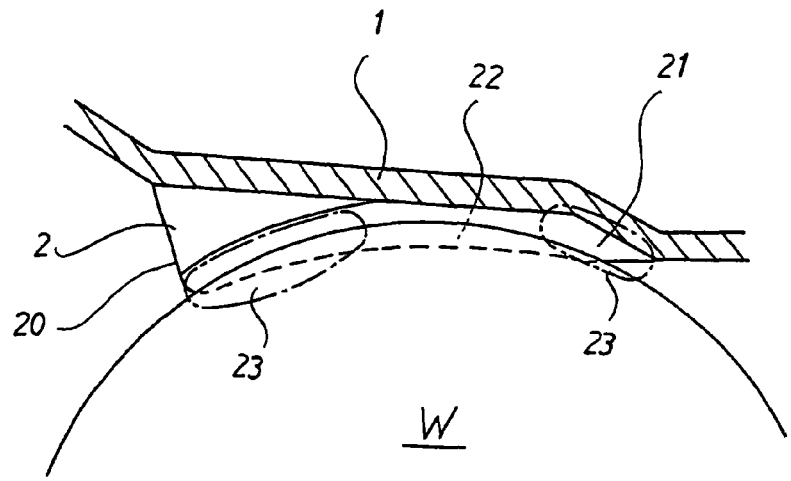
FIG. 11 is a plan view showing shelf elements in the third embodiment of a substrate storage container according to the present invention.
Figure 12:
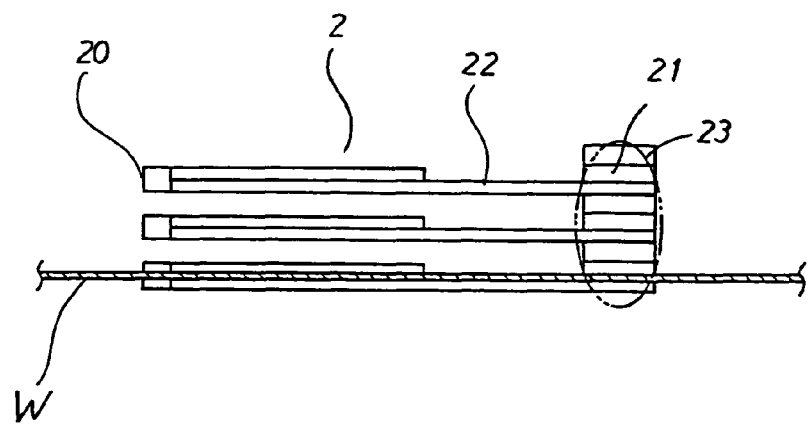
FIG. 12 is a front view showing shelf elements in the third embodiment of a substrate storage container according to the present invention.
Figure 13:
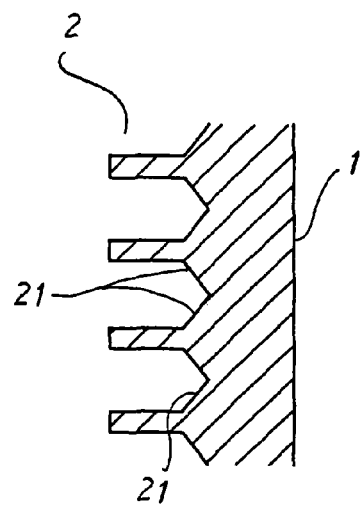
FIG. 13 is a partial sectional illustration showing shelf elements in the third embodiment of a substrate storage container according to the present invention.

As shown in FIGS. 8 to 10, shelf elements 2 are formed integrally on both sides of the container body 1 interior and arranged top to bottom with a predetermined pitch, so as to support multiple substrates W in their horizontal position with a predetermined pitch, from top to bottom. As shown in FIGS. 9 and 11, each shelf element 2 is formed as an appoximately plate-like piece, having a curved edge at its free side end corresponding to the side rim of substrate W, and having an anti-slipoff step 20 along the side rim of substrate W on the other side in its front part. The side wall that provides the function of rear stopper is formed with slanting surfaces 21 having an approximately V-shaped section for defining the insert/removal position of substrate W (at which the substrate is inserted or taken out). Anti-slipoff step 20 is formed as high as the thickness of substrate W, specifically at a height ranging from 0.3 to 0.7 mm.

One side at the front and slanting surfaces 21 at the rear of each shelf element 2, or in other words, at least part of substrate contact area 22 (encircled portions in FIGS. 11 and 12) is formed to be low-frictional resistance portions 23 having a frictional resistance lower than that of the non substrate contact area of shelf element 2. The arithmetic surface roughness of the low-frictional resistance portion 23 is set to be equal to or greater than 0.2a (0.2 µm), in terms of average roughness (Ra), or preferably within the range from 0.3a (0.3 µm) to 6.3a (6.3 µm) when measured conforming to JIS B 0601-2001. Low-frictional resistance portion 23 is formed as follows: Previously, part of the surface of the mold to be used for forming shelf elements 2 has been subjected to a grain finish process (texturing) such as matte finish, leather grain finish and the like, and this texture is transferred to the surface of shelf elements 2 when molded. The grain finish treatment of the mold may be performed by sandblast, electric discharge process, etching and others.

The reason why the arithmetic surface roughness of low-frictional resistance portion 23 is specified to be equal to or greater than 0.2a (0.2 µm) in terms of the average roughness (Ra) is that, if lower than 0.2a (0.2 µm), the frictional resistance with substrate W remains high, and when the position of container body 1 is changed from the vertical or standing position to the horizontal position, there is a risk that substrates W might stop partway without moving smoothly from rear retainer 8 and be displaced from their correct positions, thereby making pickup impossible or inducing breakage of substrates W.

The reason why the preferable arithmetic surface roughness of low-frictional resistance portion 23 is specified within the range from 0.3a (0.3 µm) to 6.3a (6.3 µm) in terms of the average roughness (Ra) is that the transfer accuracy depends on the molding conditions and the condition of mold gassing, and the above range makes it possible to secure stability upon mass production. When the average roughness (Ra) exceeds 6.3a (6.3 µm), the frictional resistance is good enough, but the grain finish areas of shelf elements 2 may be damaged or cannot be separated easily from the mold due to excessive friction at the time of mold separation after forming.

Figure 14:
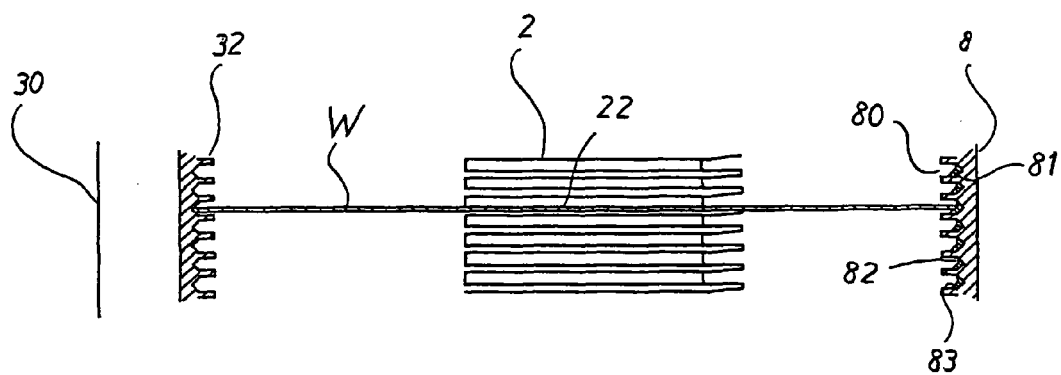
FIG. 14 is a schematic illustrative view showing the state of retainers supporting a substrate in the third embodiment of a substrate storage container according to the present invention.
Figure 15:
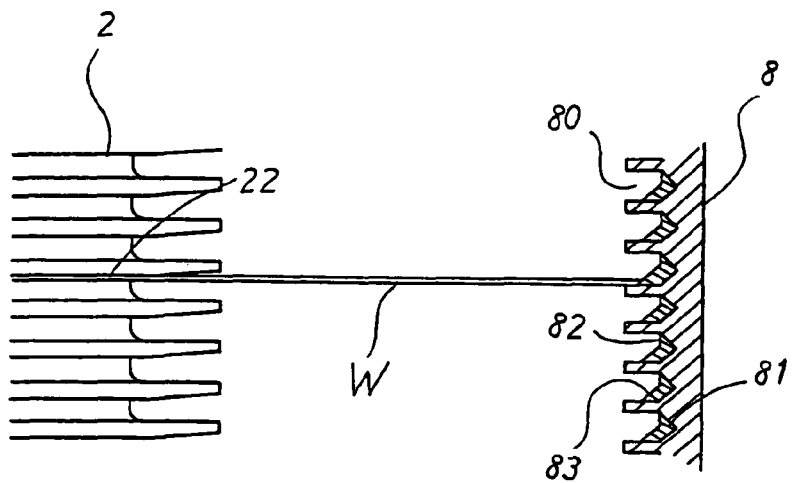
FIG. 15 is a schematic illustrative view showing the third embodiment of a substrate storage container according to the present invention, in a state where a substrate is supported by shelf elements with its door removed from the container body.

Each rear retainer 8 is formed of a material presenting a higher flexibility than shelf elements 2 in view of protecting individual substrates W, similarly to front retainer 32 arranged opposite as shown in FIGS. 9, 10 and 14, and has a multiple holding grooves 80 arranged vertically a predetermined distance apart from each other at the contact with substrates W. Each holding groove 80 is formed with a lean constraint element 81 for preventing standing substrate W from leaning. Each holding groove 80 is formed with slanting surfaces having an approximately U-shaped or approximately V-shaped section. Further, lean constraint element 81, as shown in FIG. 15, is defined by a vertical wall 82 that extends from the horizontal center line of holding groove 80 to one side and a slanting surface 83 that is located to the other side from the center line, making the sectional shape of holding groove 80 asymmetrical with respect to the center line when substrate W is placed horizontally.

Rear retainer 8 of this configuration, in corporation with front retainer 32, lifts up the rim of substrate W from shelf elements 2 by holding groove 80 and holds it at the center of lean constraint element 81 when door 30 is fitted and shuts the front opening of container body 1. Conversely, when door 30 is removed from the front of container body 1, wafer W moves down to shelf elements 2 with its rear side rim sliding along slanting surface 83 of lean constraint element 81. Other components are the same as in the above embodiment, so the description is omitted.

According to the above arrangement, substrates W slide down to individual shelf elements 2 from rear retainer 8 when door 30 is removed, but since low-frictional resistance portions 23 having a lower frictional resistance are formed in substrate contact areas 22 of shelf elements 2, no substrates W will stop partway in holding groove 80 of rear retainer 8 due to frictional force. Accordingly, it is possible to solve the problems such as mis-loading caused by displacement of substrate W from the correct position and breakage of substrate W due to interference of the substrate chuck hand of an unloading robot with the substrate.

Figure 16:
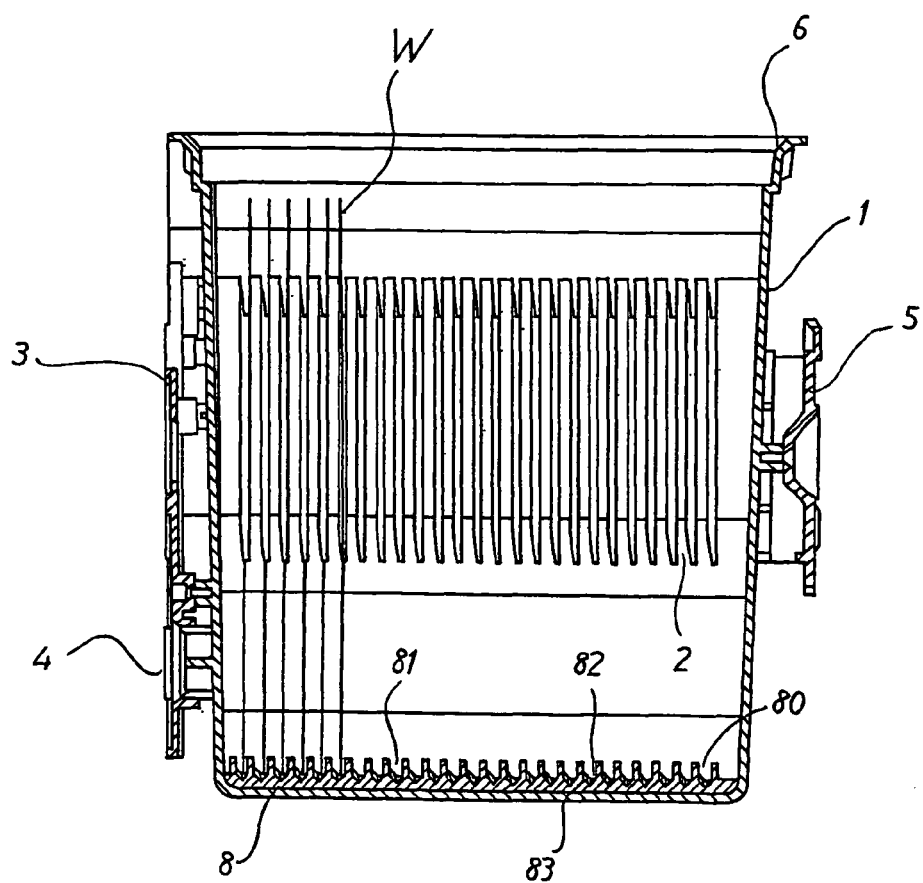
FIG. 16 is a schematic illustration showing the third embodiment of a substrate storage container according to the present invention, in a state where the container body is placed upward.

Further, even when container body 1 is handled with its front opening up and substrates W stood upright as shown in FIG. 16, all the multiple number of substrates W can be inclined in the same direction because the shape of each lean constraint element 81 forming shallow holding groove 80 of rear retainer 8 is asymmetrical with respect to the center line of substrate W where it is placed horizontally. Accordingly, it is possible to remove the risk of substrates W touching shelf elements 2, the adjacent substrates W leaning in the different directions, touching each other on the opening side of container body 1 and causing damage and pollution.

Though in the above embodiment, low-frictional resistance portions 23 are formed at one side in the front and in slanting surface 21 at the rear of shelf elements 2, the invention should not be limited to this. Low frictional resistance portions may be formed on both sides, in the container body 1 interior, continuous to these shelf elements 2 as well as in the shelf elements 2. Further, low-frictional resistance portions 23 may be formed in whole or in part of holding grooves 80 of rear retainer 8.

Next, the example of the substrate storage container according to the present invention will be described together with a comparative example.

EXAMPLE

A container body of a substrate storage container shown in FIG. 8 was injection molded using polycarbonate, so that low-frictional resistance portions 23 having an average surface roughness (Ra) of 0.3a (0.3 µm) were formed by a grain finish treatment. The surface roughness was measured by a probe contact type surface roughness tester [a Mitutoyo model, trade name: Surf test 501]. In this configuration, a 300 mm wafer (silicon wafer) as a substrate was placed on the shalf, and the frictional resistance generated when the wafer was moved in the horizontal direction was measured by a push-pull gauge having a full scale of 50 N [a product of AIKOH ENGINEERING CO., LTD., trade name: AWF-50]. The measurement result is shown in Table 1. This measurement was done at six points, the 1st stack, 5th stack, 10th stack, 15th stack, 20th stack and 25th stack, from bottom, and the average value was calculated.

COMPARATIVE EXAMPLE

Figure 17:
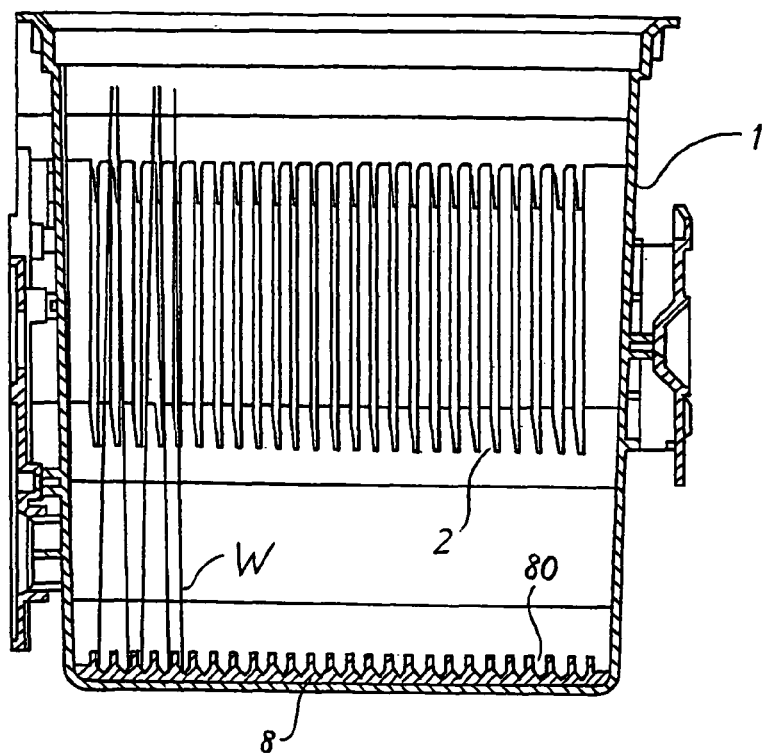
FIG. 17 is a sectional illustration showing a case where a conventional substrate storage container is stood upright so that substrates are handled standing upright.
Figure 18:
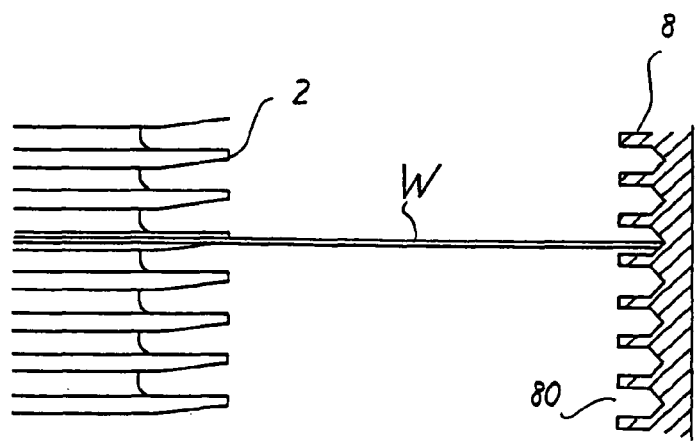
FIG. 18 is a partial sectional illustration showing a state where a substrate is supported horizontally by shelf elements of a conventional substrate storage container.

A container body shown in FIG. 17 was injected molded using polycarbonate. No grain finish process was done for the shelf elements of this container body, and the surface roughness of the shelf elements was set to be 0.1a (0.1 µm) or below, in terms of the average roughness (Ra). In this configuration, a 300 mm wafer was placed on the shelf, and the frictional resistance generated when the wafer was moved in the horizontal direction was measured by a push-pull gauge having a full scale of 50 N [a product of AIKOH ENGINEERING CO., LTD., trade name: AWF-50]. The measurement result is shown in Table 1. The other conditions were the same as in the example.

TABLE 1

| | Surface roughness | Frictional resistance between shelf and wafer (N) | | |
|---|---|---|---|---|
| | Ra (μm) | Average | Maximum | Minimum |
| Example | 0.3a | 0.19 | 0.25 | 0.15 |
| Comp. Ex. | 0.1a | 1.28 | 1.96 | 0.49 |

As understood from Table 1, the frictional resistance between the shelves and the wafer in the example was reduced to ⅙. It was also confirmed that the wafers slid smoothly from the holding grooves of the rear retainer to the shelves.

INDUSTRIAL APPLICABILITY

The present invention is effective in preventing substrates and clean environments for substrate processing from being polluted with generation of abrasive particles.

It is also effective to inhibit damage to substrates by reducing the frictional resistance of the shelf elements. Further, when substrates are handled standing upright, the present invention is effective in preventing the substrates from touching the shelf elements or touching each other and hence preventing breakage and other damage, by constraining the leaning of the substrates.

The invention claimed is:

1. A substrate storage container including:
   a container body of a front-opening box for storing substrates therein;
   a door for opening and closing the front of the container body;
   an attachment hole formed in at least one of the container body and the door; and
   an inner-pressure adjustment device attached to the attachment hole for adjusting the pressure inside the container body closed with the door,
   wherein the inner-pressure adjustment device comprises an elastic attachment cylinder removably fitted to the attachment hole by elastic deformation thereof without the use of an O-ring and formed in cylindrical shape having a first opening at one end face and a second opening smaller than the first opening at an other end face, a hollow filter support structure fitted into the attachment cylinder without any gap in the axial direction of the attachment cylinder from the first opening and a filter held inside the filter support structure,
   wherein the attachment cylinder has a pair of juxtaposed flanges integrally formed on the outer periphery thereof and fitted and engaged to the periphery of the attachment hole, and
   wherein the filter support structure is composed of a pair of support pieces arranged opposite to and attached to each other, each of said pair of support pieces having an approximately T-shaped or funnel-shaped section and at least one of the support pieces is tightly fitted from one side of the second opening of attachment cylinder toward an other side thereof so that a portion of the at least one of the support pieces projects out from the other side.

2. The substrate storage container according to claim 1, wherein a guide rib for the inner-pressure adjustment device is formed near the attachment hole.

3. The substrate storage container according to claim 1, each support piece has an approximately cylindrical form, and the opposing parts of the support pieces are extended outwards with respect to the width direction, forming filter holders.

4. The substrate storage container according to claim 1, wherein shelf elements for supporting substrates are formed on both interior sides of the container body, and among the interior sides of the container body and the shelf elements, at least part of the substrate contact area of each shelf element is formed with a low-frictional resistance portion that is lower in frictional resistance than the non substrate contact area of the shelf element.

5. The substrate storage container according to claim 1, wherein grooves for supporting substrates are formed at the interior backside of the container body and include a lean constraint element for preventing a standing substrate from leaning, and the sectional shape of each groove is configured to be asymmetrical with respect to the center line of the substrate when the substrate is placed horizontally.

6. The substrate storage container according to claim 4, wherein the arithmetic average roughness of the low-frictional resistance portion is specified to be 0.2a or above in terms of the average roughness (Ra).

* * * * *